United States Patent [19]

Wada

[11] Patent Number: 5,739,998
[45] Date of Patent: Apr. 14, 1998

[54] PROTECTIVE CIRCUIT AND SEMICONDUCTOR INTEGRATED CIRCUIT INCORPORATING PROTECTIVE CIRCUIT

[75] Inventor: Satoshi Wada, Kanagawa-ken, Japan

[73] Assignee: Kabushiki Kaisha Toshiba, Kawasaki, Japan

[21] Appl. No.: 679,114

[22] Filed: Jul. 12, 1996

[51] Int. Cl.$^6$ ............................................. H02H 9/00
[52] U.S. Cl. ........................... 361/56; 361/111; 257/355
[58] Field of Search ....................... 361/56, 91, 111; 257/355–360

[56] References Cited

U.S. PATENT DOCUMENTS

| | | | |
|---|---|---|---|
| 4,858,055 | 8/1989 | Okitaka | 361/91 |
| 4,868,705 | 9/1989 | Shiochi et al. | 361/91 |
| 5,086,365 | 2/1992 | Lien | 361/58 |
| 5,514,893 | 5/1996 | Miyanaga et al. | 257/360 |
| 5,615,073 | 3/1997 | Fried et al. | 361/56 |

Primary Examiner—Jeffrey A. Gaffin
Assistant Examiner—Michael J. Sherry
Attorney, Agent, or Firm—Oblon, Spivak, McClelland, Maier & Neustadt, P.C.

[57] ABSTRACT

A protective circuit in a semiconductor integrated circuit for protecting a semiconductor integrated circuit chip from an over voltage having a predetermined voltage potential level supplied to an input/output terminal in the semiconductor integrated circuit having a P-MOS FET whose drain electrode is connected to the input/output terminal and whose source electrode and drain electrode are commonly connected to a first power source, and a first N-MOS FET whose source electrode is connected to a back gate of the P-MOS FET, whose drain electrode and gate electrode are connected to the first power source and whose back gate is connected to a second power source, and a second N-MOS FET whose drain electrode is connected to the input/output terminal and whose source electrode, gate electrode and whose back gate are connected to the second power source.

18 Claims, 12 Drawing Sheets

5,739,998

PROTECTIVE CIRCUIT AND SEMICONDUCTOR INTEGRATED CIRCUIT INCORPORATING PROTECTIVE CIRCUIT

BACKGROUND OF THE INVENTION

1. Field of the Invention

The present invention relates to a protective circuit for protecting internal logic circuits from over-voltage applied to an input/output terminal, through which signals of a positive electric voltage potential level are received, to which the protective circuit is connected and a semiconductor integrated circuit incorporating the protective circuit.

2. Description of the Prior Art

Traditionally, there is a protective circuit having a configuration shown in FIG. 1 in the technical field for protective circuits.

FIG. 1 is a diagram showing a configuration of a semiconductor integrated circuit in which a protective circuit made up of a metal-oxide semiconductor field effect transistor (hereinafter referred to as "MOS type FET") is incorporated as an example of a conventional protective circuit.

The conventional protective circuit having the configuration, as shown in FIG. 1, has at least one internal logic circuit 102 connected to an input/output terminal 101 for receiving signals of positive electrical voltage potential level. The conventional MOS type FET protective circuit 103 is connected between the input/output terminal 101 and the internal logic circuit 102. The conventional MOS type FET protective circuit 103 protects the internal logic circuit 102 from over-voltage applied to the input/output terminal 101 in abnormal conditions.

In this manner, the conventional MOS type FET protective circuit 103, as shown in FIG. 1, is made up of a P channel MOS type FET 103A (hereinafter referred to as "P-MOS type FET") and a N channel MOS type FET 103B (hereinafter referred to as "N-MOS type FET"). The source terminal (or the source electrode) and the gate terminal (or the gate electrode) of the P-MOS type FET 103A are connected to a power source VDD of a high voltage level so that the P-MOS type FET 103A is in the OFF state. In addition, the source terminal and the gate terminal of the N-MOS type FET 103B are connected to a power source VSS of a ground voltage level so that the N-MOS type FET 103B also is in the OFF state.

Both back gates of the P-MOS type FET 103A and the N-MOS type FET 103B are connected to the power sources VDD and VSS, respectively as shown in FIG. 1.

FIG. 2 and FIG. 3 are a circuit diagram and a schematic sectional view of the conventional protective circuit 103 shown in FIG. 1, respectively. In these diagrams, the same reference numbers and characters are used for the same components.

FIGS. 4A to 4C are plan views showing that semiconductor integrated circuit chips are mounted on a user board 36 (see FIG. 4A), a mother board (see FIG. 4B), and nodes 1 to 4 (see FIG. 4C), for example.

In FIGS. 4A to 4C, reference numbers 31 to 34 designate semiconductor integrated circuit chips, a reference number 35 denotes a driver (DRV.) 35 for controlling the operations of the semiconductor integrated circuit chips 31 to 34. FIG. 4A shows a case that the semiconductor integrated circuit chips 31 to 34 and the driver 35 are mounted on the user board 36. FIG. 4B shows a case that each of the semiconductor integrated circuit chips 31 to 34 is mounted on each user board 36 and the driver 35 is mounted on the mother board. In this case, the driver 35 on the mother board controls the operations of the semiconductor integrated circuit chip on each user board 36. FIG. 4C shows a case that each of the semiconductor integrated circuit chips 31 to 34 is placed on each of nodes 1 to 4 and the driver 35 is placed in a node for a supervisory control system. Although there are other configurations of the driver and the semiconductor integrated circuit chips in this field, the other configurations are omitted for brevity.

FIG. 5 is a schematic plan view showing a configuration of one semiconductor integrated circuit 31 in the semiconductor integrated circuit chips 31 to 34 shown in FIGS. 4A to 4C. In this diagram, reference numbers 41 and 42 denote pads for the high voltage power source VDD and the low voltage power source VSS. The reference number 103 designates the protective circuit and the reference number 102 indicates the internal logic circuits. These components are the same components shown in FIG. 1.

During a normal operation mode, namely, when the driver 35 shown in FIGS. 4A to 4C sets the semiconductor integrated circuit chips 31 to 34 into the normal operation mode and when an over-voltage over a predetermined voltage potential is applied to the input/output terminal 101 in each semiconductor integrated circuit chip, the protective circuit 103 protects the internal logic circuit 102 from being destroyed by allowing current to flow through a P-N junction (P-N connection section) in the OFF transistor of the P-MOS type FET 103A or the N-MOS type FET 103B, because the P-N junction is forward biased.

However, in the configuration of the conventional MOS type FET protective circuit 103 shown in FIG. 1, leak current is generated and flows in the P-MOS type FET 103A in the protective circuit 103 designated by the solid arrow shown in FIGS. 1 and 2 and the dashed arrow shown in FIG. 3, for example, when the driver 35 sets some or all of the semiconductor integrated circuit chips 31 to 34 into the OFF state and when the voltage potential of the power source VDD becomes 0 volt (the earth voltage potential level) and a signal of the positive voltage level is applied to the input/output terminal 101. This leak current causes an error in the operation of the internal logic circuit in the semiconductor integrated circuit that is not in the OFF state.

We will further explain this phenomenon in detail. During the normal operation mode, the high voltage power source VDD is supplied to the semiconductor integrated circuits 31 to 34 through the pads 41 therein. In this case, the P-MOS type FET 103A and the N-MOS type FET 103B are in the OFF state. When the signal of the positive voltage potential level (for example, a transistor-transistor logic level) is supplied to the input/output terminal 101, there is no leak current in the P-N junction of the P-MOS type FET or the N-MOS type FET in the OFF state because the P-N junction of the P-MOS type FET or the N-MOS type FET in the OFF transistor state is reverse biased.

On the other hand, we will consider the condition that the power source VDD for one of the semiconductor integrated circuit chip S31-34 transitions to the OFF state, namely goes to zero volts, the driver 35 and a signal of the positive voltage potential level is supplied to the input/output terminal 101. In other words, for example, this state described above means that the input/output terminals 101 of the semiconductor integrated circuit chips 31 to 34 are connected to a bus line and the power source VDD of the zero voltage level is supplied to one of the integrated circuit chips 31 to 34 and the power source VDD of the high voltage level is supplied to the other semiconductor integrated circuit chips.

In this case, because the N-MOS type FET 103B in the OFF state is connected to the power source VSS, it is not affected by the change of the power source voltage level VDD. On the other hand, the voltage potential level of the power source VDD goes the VSS voltage level from the VDD voltage level at the source terminal and the gate terminal of the P-MOS type FET 103A. Thereby, when the signal of positive voltage potential level is provided to the input/output terminal 101, the P-N junction formed between the drain section and the back gate section of the P-MOS type FET 103A in the OFF state is forward biased. In this case, as shown in FIG. 3, the leak currents designated by the dashed arrows flow. The voltage potential level of a signal on the bus line can not be increased to a required voltage potential level. This state causes errors in the operation of the other semiconductor integrated circuits, whose pads 41 have the VDD voltage potential level, connected to the bus line.

SUMMARY OF THE INVENTION

Accordingly, an object of the present invention is, with due consideration to the drawbacks of the conventional protective circuit used in semiconductor integrated circuit chips, to provide a protective circuit and a semiconductor integrated circuit incorporating the protective circuit to protect against an over-voltage supplied to an input/output terminal of the semiconductor integrated circuit. There is no leak current in the semiconductor integrated circuit by the protective circuit of the present invention even if the VDD voltage of the semiconductor integrated circuit goes to zero volts (the VSS voltage level) and a signal of positive voltage potential level is applied to the input/output terminal of the semiconductor integrated circuit.

A further object of the present invention is to provide a protective circuit and a semiconductor integrated circuit, each having a simple configuration and having the same withstand voltage level of a conventional protective circuit, which is capable of cutting or interrupting leak current or stopping the generation of leak current when the power source of the semiconductor integrated circuit is in the OFF state.

In accordance with one aspect of the present invention, a protective circuit protects a semiconductor integrated circuit chip from an over-voltage having a predetermined voltage potential level supplied to an input/output terminal in the chip. The protective circuit comprises a first metal-oxide semiconductor field effect transistor of a first conductivity type (a first MOS FET of a first conductive type) whose drain electrode is connected to the input/output terminal for receiving and transferring signals and whose source electrode and drain electrode are connected to a first power source and a first MOS FET of a second conductivity type whose source electrode is connected to the back gate of the first MOS FET of the first conductivity type whose drain electrode and gate electrode are connected to the first power source, and whose back gate is connected to a second power source.

In accordance with a further aspect of the present invention, a protective circuit protects a semiconductor integrated circuit chip from an over-voltage supplied to an input/output terminal in a semiconductor integrated circuit in this chip. This protective circuit comprises a first MOS FET of a first conductivity type whose drain electrode is connected to the input/output terminal for receiving and transferring signals and whose source electrode and gate electrode are connected to a first power source, a second MOS FET of a second conductive type whose source electrode is connected to a back gate of the first MOS FET of the first conductivity type, whose drain electrode and source electrode are connected to the first power source, and whose back gate is connected to a second power source, and a second MOS FET of the second conductivity type whose drain electrode is connected to the input/output terminal and whose source electrode, gate electrode and back gate are commonly connected to the second power source.

In accordance with another aspect of the protective circuit of the present invention, the voltage level of the first power source is higher than the voltage level of the second power source.

In accordance with another aspect of the protective circuit of the present invention, the first MOS FET of the first conductivity type is a P-MOS FET and the first MOS FET of the second conductivity type is an N-MOS FET.

In this embodiment of the protective circuit, the first MOS FET of the first conductivity type is a P-MOS FET and each of the first and second MOS FETs of the second conductive type is a N-MOS FET.

In accordance with another preferred embodiment of the present invention, a semiconductor integrated circuit comprises the protective circuit described above, and at least one internal logic circuit connected to the protective circuit.

In addition, in accordance with another preferred embodiment of the present invention, a semiconductor integrated circuit comprises the two kinds of the protective circuits described above, the first type protective circuit and the second type protective circuit, and at least two internal logic circuits connected to the protective circuits.

Further, in the semiconductor integrated circuit of the present invention described above, each source length and drain length of the first MOS FET of the first conductivity type in the second type protective circuit is formed to be approximately at least double of each source length and drain length of the first MOS FET of the first conductivity type in the first type protective circuit.

In addition, in the semiconductor integrated circuit of the present invention described above, the voltage level of the first power source is higher than the voltage level of the second power source.

Moreover, in the semiconductor integrated circuit described above, the first MOS FET of the first conductive type is an N-MOS FET and the first MOS FET of the second conductive type and the second MOS FET of the second conductive type are N-MOS FETs.

Thus, in the protective circuit and the semiconductor integrated circuit having the protective circuit of the present invention, because the bias voltage applied to the back gate section of the first MOS FET of the first conductivity type is supplied through the first MOS FET of the second conductivity type, the first MOS FET of the first conductivity type can perform the function of that in a conventional protective circuit. Because the first MOS FET of the second conductivity type enters an OFF state when the first power source of the semiconductor integrated circuit goes into an ON state, there is no leak current in the first MOS FET of the first conductivity type even if a signal of positive voltage level is supplied to the input/output terminal connected to the first MOS FET of the first conductivity type when the first power source is at zero voltage potential level.

In accordance with another aspect of the present invention, a semiconductor integrated circuit comprises an input/output terminal, at least an internal logic circuit connected to the input/output circuit, and a protective circuit for protecting against an over voltage having more than a predetermined voltage potential level supplied to the input/output terminal. In the semiconductor integrated circuit, the protective circuit is placed between the input/output terminal and the internal circuit.

These and other objects, features, aspects and advantages of the present invention will become more apparent from the following detailed description of the present invention when taken in conjunction with the accompanying drawings.

DESCRIPTION OF THE PREFERRED EMBODIMENTS

Other features of the present invention will become apparent through the following description of preferred embodiments which are given for illustration of the present invention and are not intended to be limiting thereof.

Embodiment 1

Figure 6:
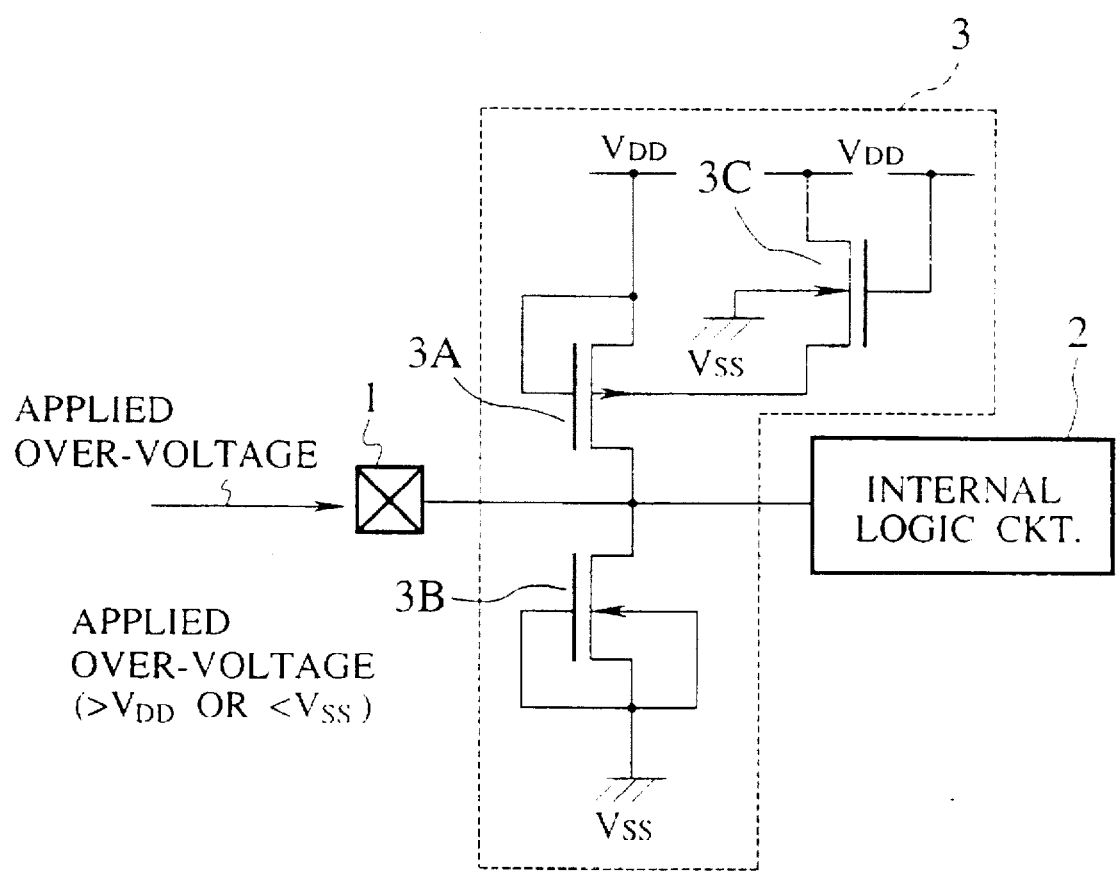
FIG. 6 is a configuration diagram of a semiconductor integrated circuit having a MOS FET type protective circuit according to the first embodiment of the present invention.
Figure 7:
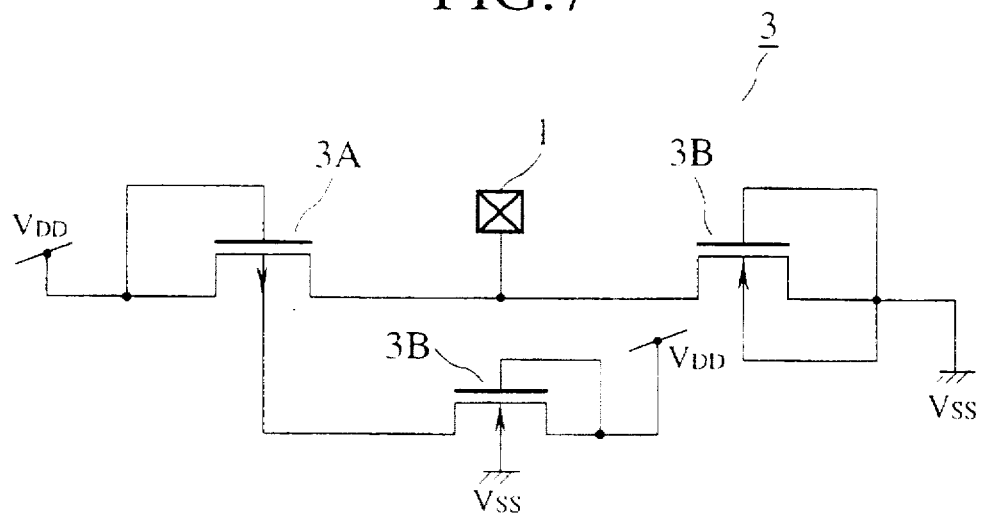
FIG. 7 is a circuit diagram showing the MOS FET type protective circuit according to the first embodiment of the present invention shown in FIG. 6.
Figure 8:
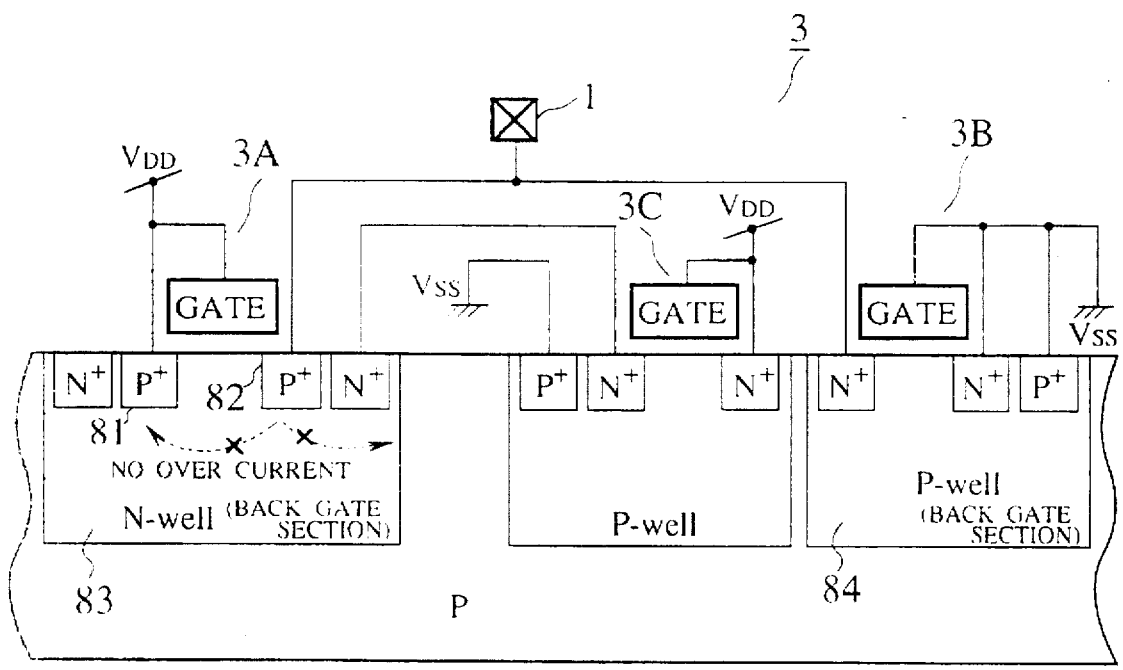
FIG. 8 is a schematic sectional view of the MOS FET type protective circuit according to the first embodiment of the preset invention shown in FIG. 7.

FIG. 6 is a configuration diagram of a semiconductor integrated circuit in which a MOS FET type protective circuit according to the first embodiment of the present invention is incorporated. FIG. 7 is a circuit diagram showing the MOS FET type protective circuit as the first embodiment of the present invention as shown in FIG. 6. In addition, FIG. 8 is a schematic sectional view of the MOS FET type protective circuit as the first embodiment of the present invention as shown in FIG. 7.

Figure 4A:
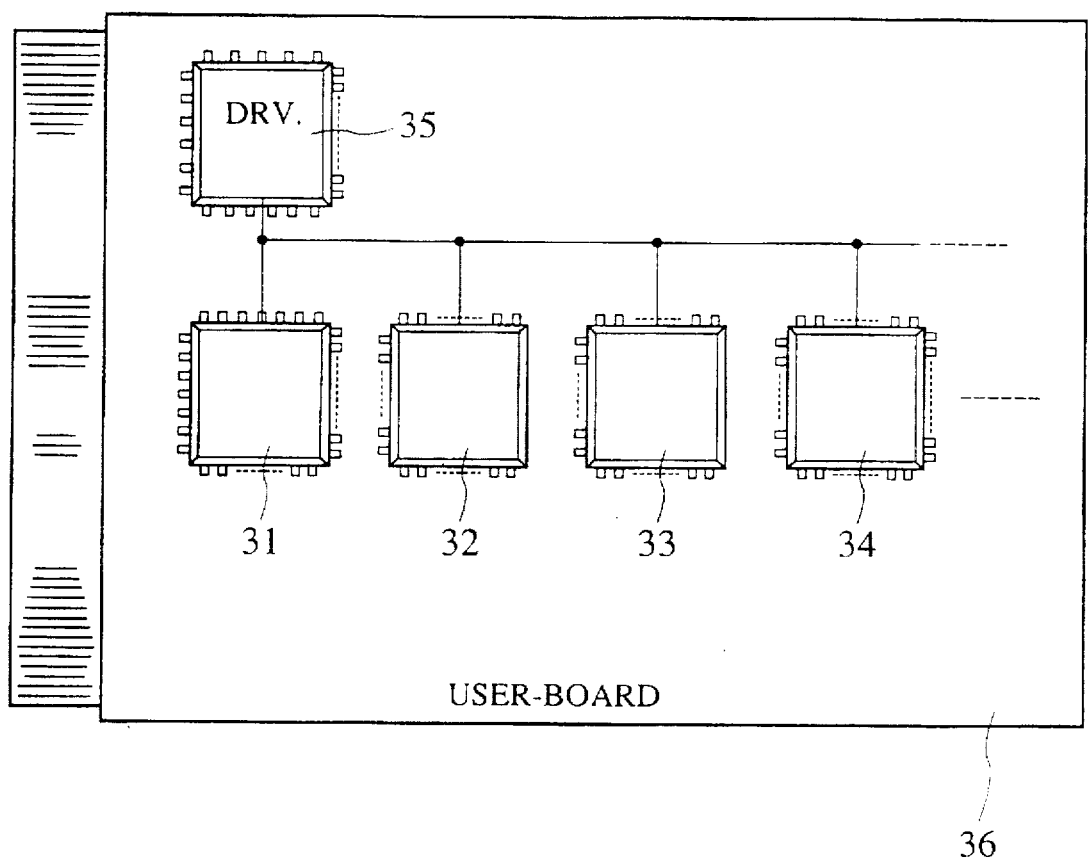
FIGS. 4A to 4C are plan views of boards such as a user board and a mother board on which the semiconductor integrated circuit chips are mounted.
Figure 4B:
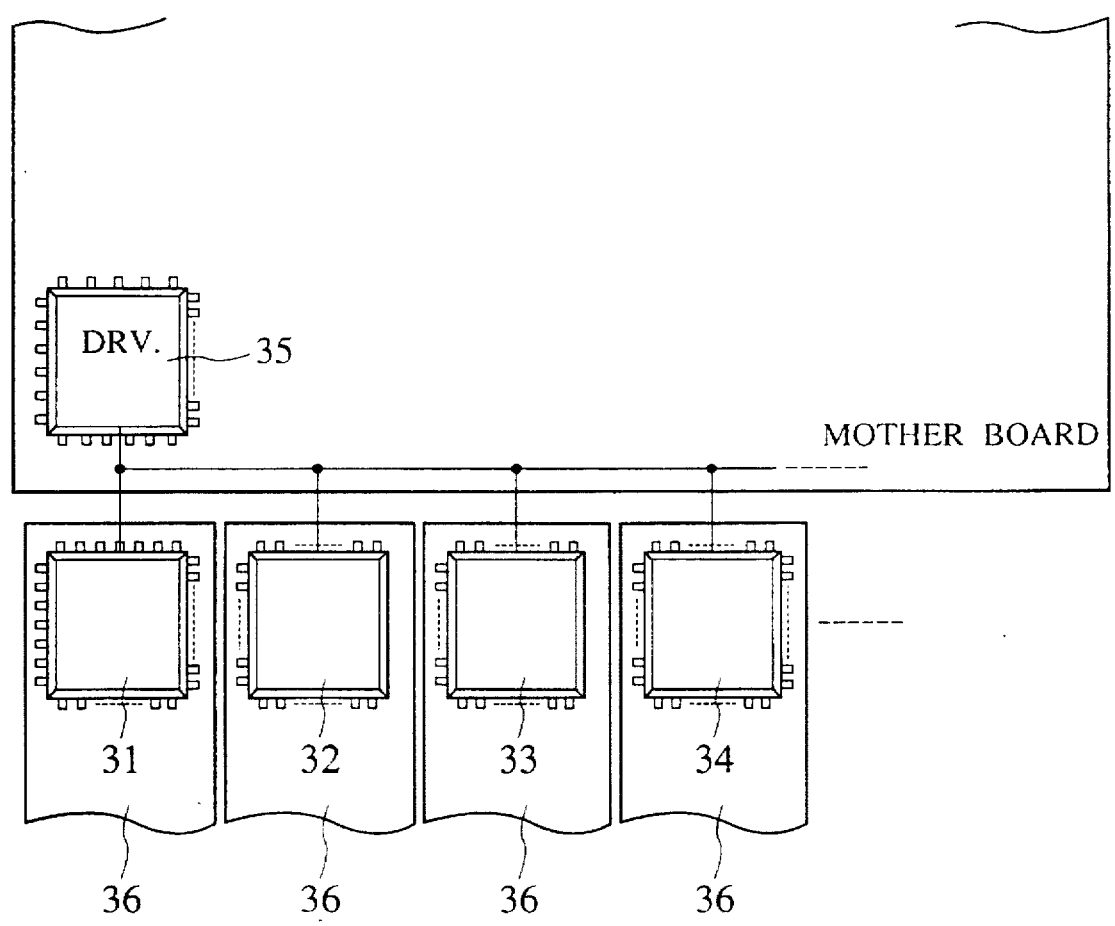
Figure 4C:
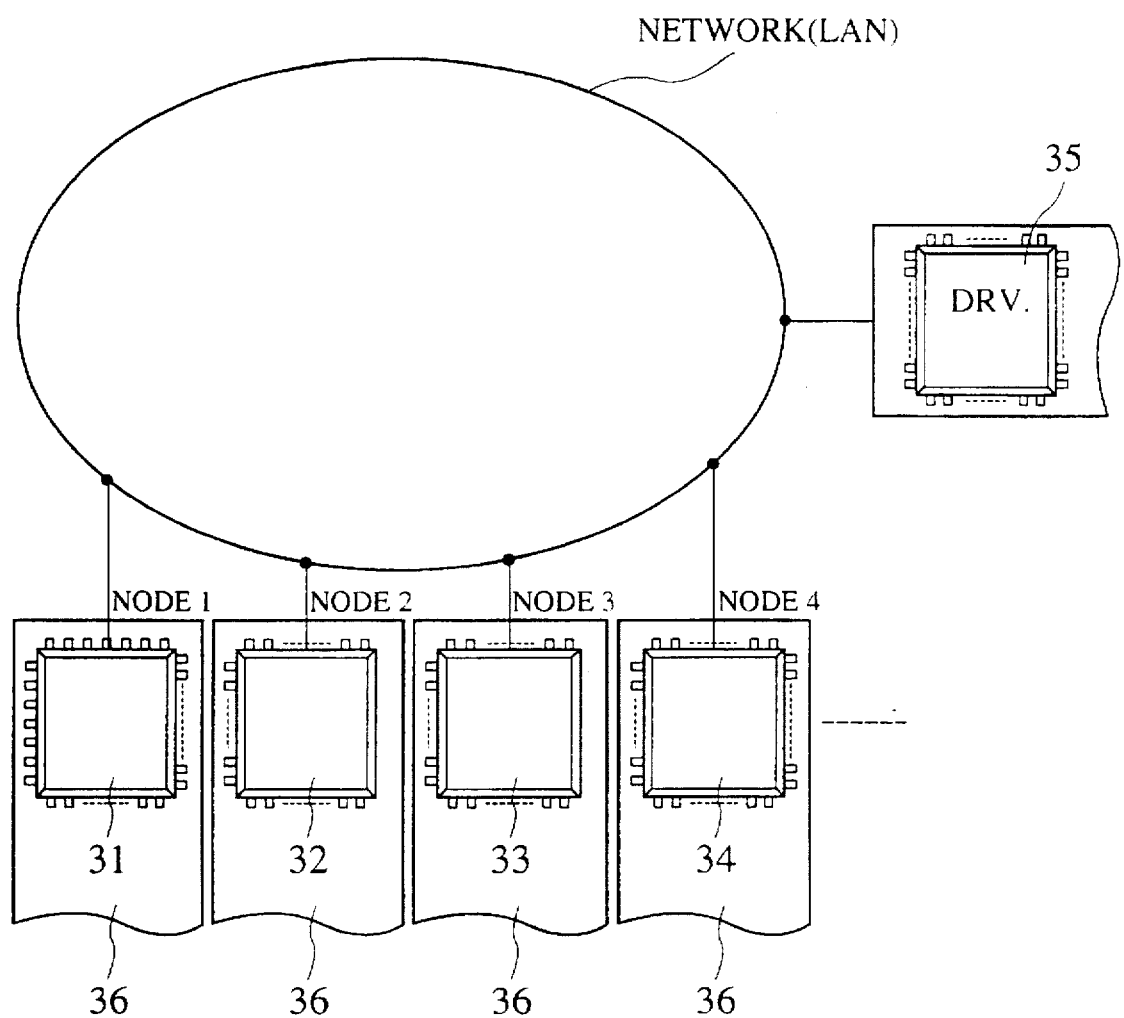
Figure 5:
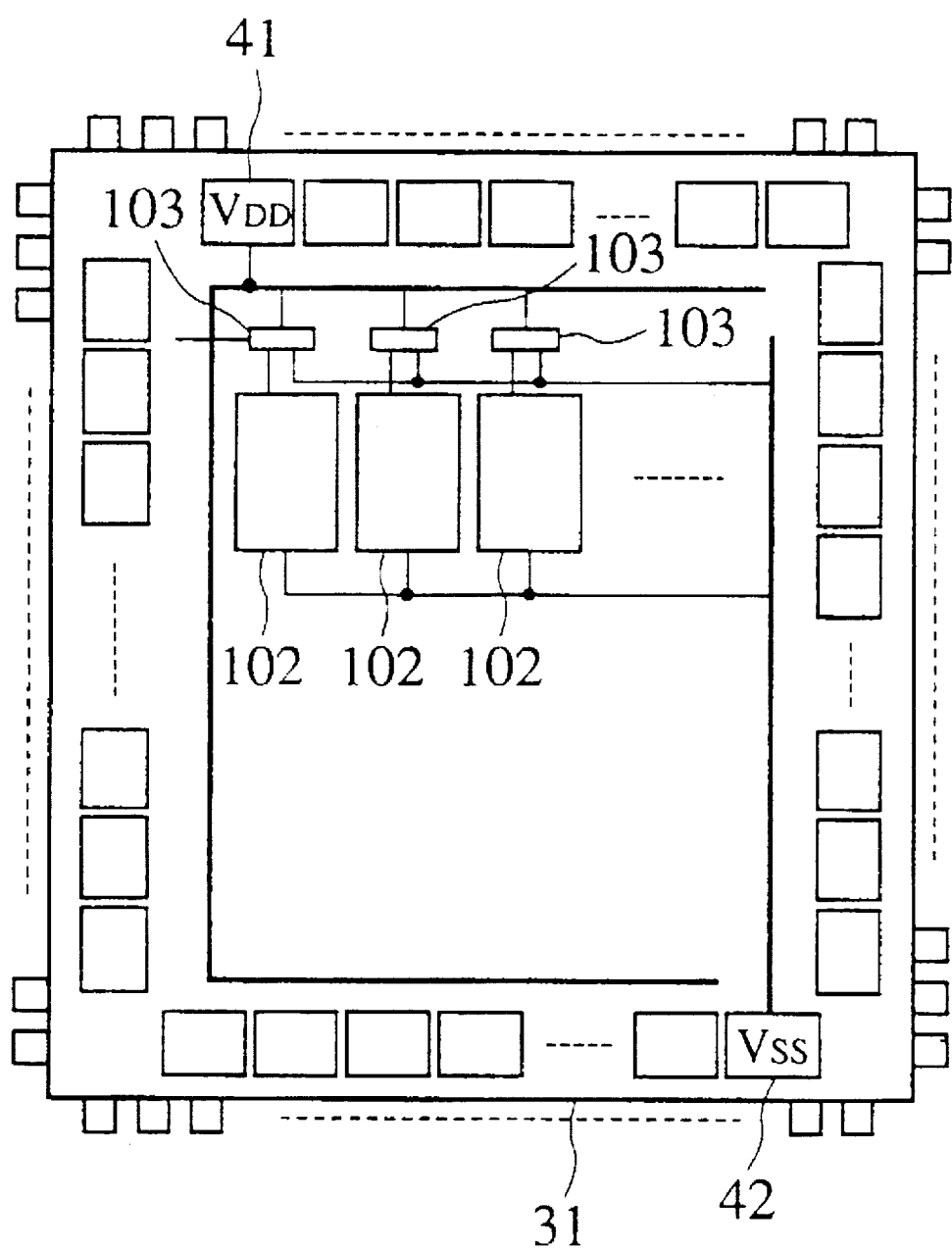
FIG. 5 is an internal configuration diagram of one of the semiconductor integrated circuit chips shown in FIGS. 4A to 4C.

The semiconductor integrated circuit having the protective circuit 3 of the first embodiment will be mounted on user-boards or nodes, as the semiconductor integrated circuit chip, as shown in FIGS. 4A to 4C, for example. Some or the all of the semiconductor integrated circuit chips 31 to 34 are respectively selected and set to an operation state under the control of the driver 35 shown in FIGS. 4A to 4C.

The semiconductor integrated circuit having the protective circuit 3 of the first embodiment having the configuration shown in FIG. 6, comprises an internal logic circuit 2 (or at least two internal logic circuits (not shown)) connected to an input/output terminal 1 in order to receive and transfer signals of a positive voltage level. The MOS FET type protective circuit 3 of the first embodiment to protect the internal logic circuit 2 from an over-voltage is connected to the input/output terminal 1.

Through this description and appended claims according to the present invention, the technical term "Over-voltage" is defined and used that the over-voltage is the voltage whose potential level is more than the power source VDD. When a voltage of more than VDD (for example, +7.0 volts) is applied to the input/output terminal 1 shown in FIG. 6, this applied voltage is called as the "over-voltage" or "positive over-voltage". Furthermore, when a negative voltage whose voltage potential level (for example, −7.0 volts) is not more than zero volts (ground level) is applied to the input/output terminal 1, this applied voltage is also called as "over-voltage" or "negative over-voltage" (see FIG. 6).

As shown in FIGS. 6, 7 and 8, the protective circuit 3 of the first embodiment comprises a P-MOS FET 3A, an N-MOS FET 3B and an N-MOS FET 3C.

Figure 1:
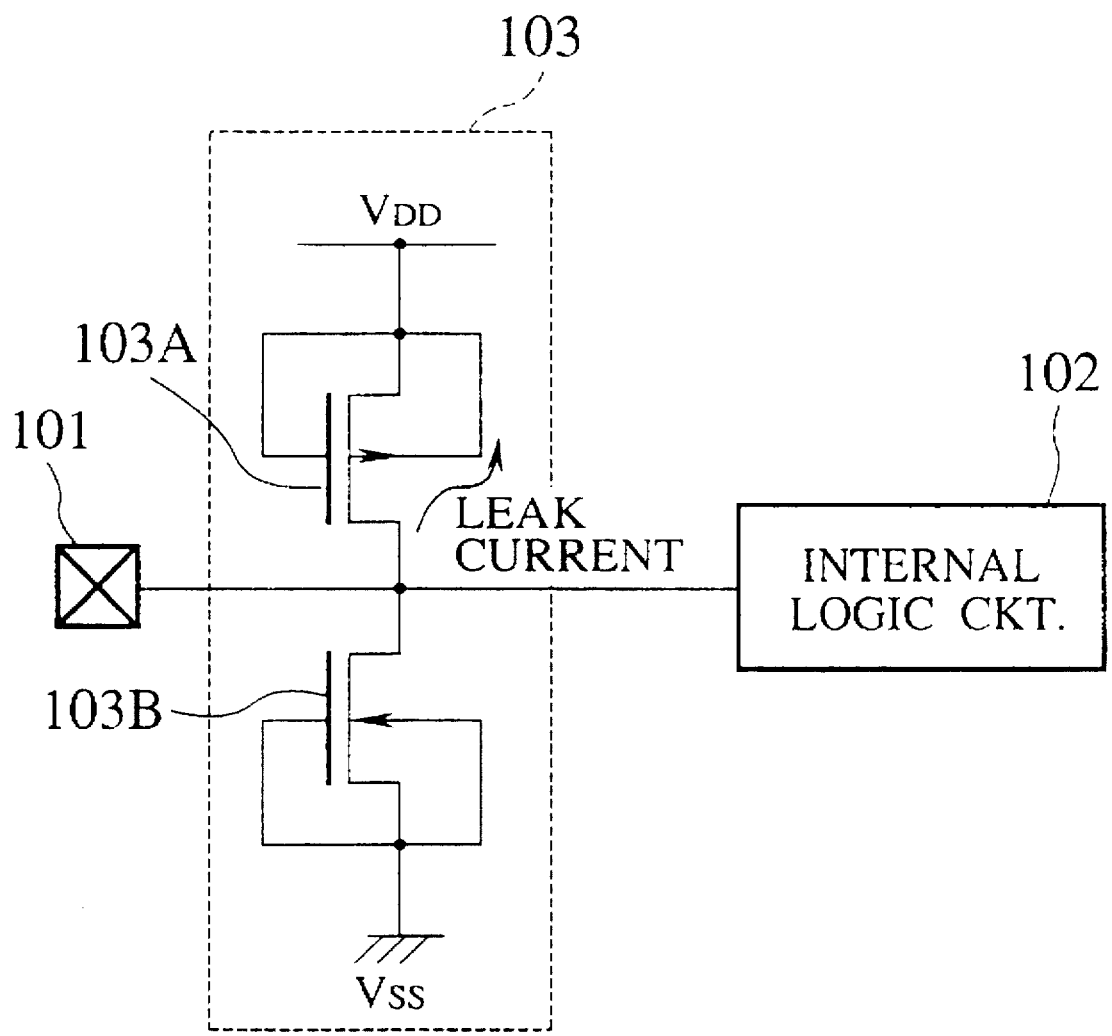
FIG. 1 is a circuit diagram of a semiconductor integrated circuit having a conventional MOS FET type protective circuit.
Figure 2:
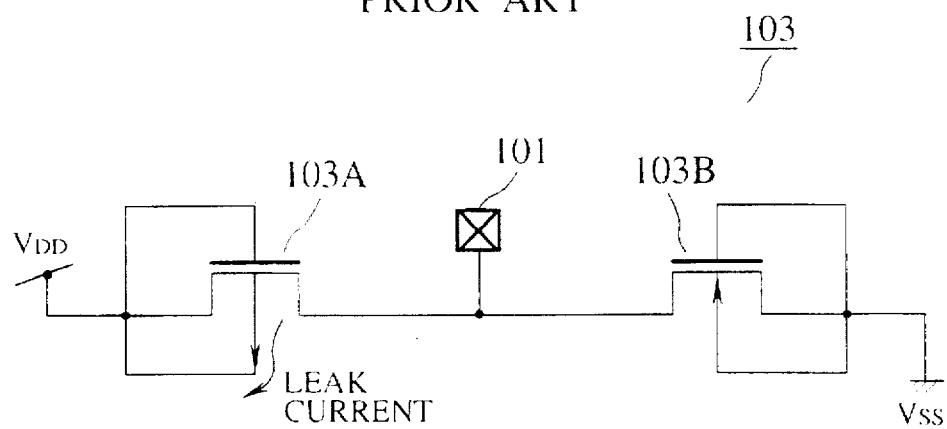
FIG. 2 a circuit diagram of the conventional MOS FET type protective circuit as shown in FIG. 1.
Figure 3:
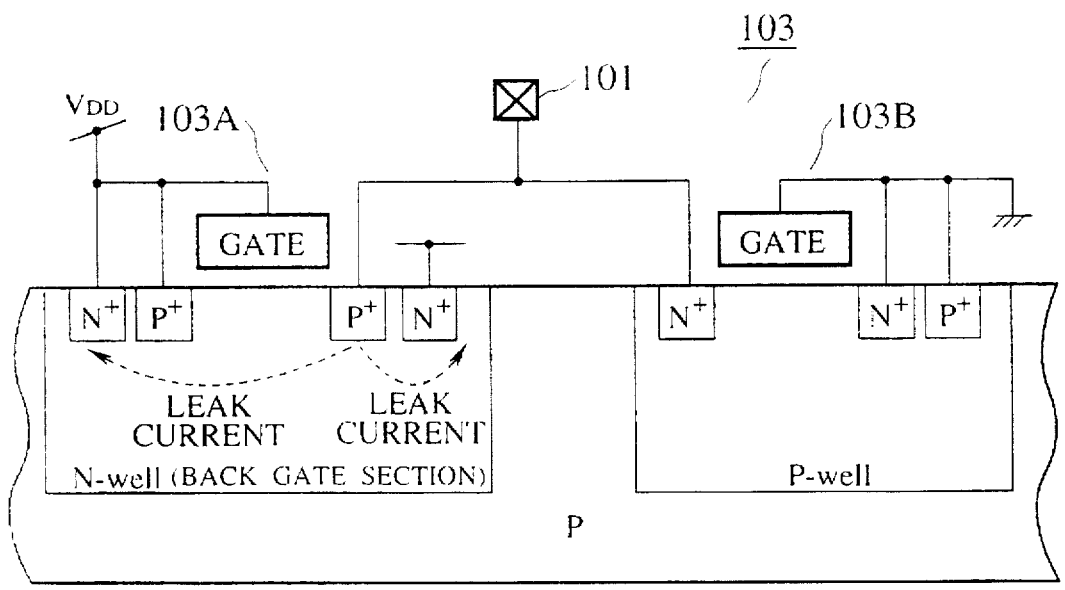
FIG. 3 is a schematic sectional view of the conventional MOS FET type protective circuit shown in FIG. 2.

That is, in detail, a drain electrode of the P-MOS FET 3A is connected to the input/output terminal of the internal logic circuit 2 and a source electrode and a gate electrode of the P-MOS FET 3A are connected to the power source VDD in order to set the P-MOS FET into an OFF state. A drain electrode of the N-MOS FET 3B is connected to the input/output terminal 1 and a source electrode and a gate electrode of the N-MOS FET 3B are connected to a power source VSS in order to set the N-MOS FET 3B to the OFF state. In addition, a bias voltage is applied to a back gate section 83 of the P-MOS FET 3A through the N-MOS FET 3C. The back gate section 83 is an area of the N-well region shown in FIG. 8. The N-well region is used as the back gate section 83 through the description. When the concentration of the back gate section 83 (namely, the N-well region) is changed, the threshold voltage can be changed, so that no over-current flows from the source region 82 to the drain region 81 through the dashed line shown in FIG. 8. This is one of the important features of the present invention and this point is different from the configuration of the conventional protective circuit as shown in FIGS. 1 to 3.

The gate and drain electrodes of the N-MOS FET 3C as the OFF transistor are connected to the power source VDD and a source electrode of the N-MOS FET 3C is connected to the back gate section 83 of the P-MOS FET 3A. The power source VSS is directly supplied to the back gate section of the N-MOS FET 3C.

Next, the operation of the protective circuit 3 of the first embodiment will be explained.

First, the operation of the protective circuit 3 of the first embodiment will be explained under the condition that the power source VDD is supplied to the semiconductor integrated circuit chips 31 to 34 based on the control of the driver 35 shown in FIGS. 4A to 4C. When the input/output terminal 1 receives the signal of a positive voltage level (for example a high level), as shown in FIG. 8, the voltage difference between a P-N junction formed between the n-well and the drain electrode of the P-MOS FET 3A and the back gate section of the N-MOS FET 3B becomes approximately zero (namely, in a reverse biased or unbiased state). In this case, there is no leak current at the above P-N junction.

When a positive over-voltage whose voltage level is more than the power source VDD is applied (or when a negative over-voltage whose voltage level is less than the ground level Vss is applied) to the input/output terminal 1 shown in FIG. 8, leak current flows through the P-N junction in a forward bias state formed between the P-MOS FET 3A through the back gate section or the drain electrode of the N-MOS FET 3B and the back gate in the protective circuit 3. In this case, the protective circuit 3 protects components formed in the internal logic circuit 2 from the over-voltage.

Next, the operation of the semiconductor integrated circuit chips to which the power source VDD is not supplied will be explained.

For example, the operation of the protective circuit 3 of the first embodiment will be explained under the condition that the power source VDD is not supplied to the semiconductor integrated circuit chips 31 to 34 based on the control of the driver 35 shown in FIGS. 4A to 4C.

Because the N-MOS FET 3B uses the power source VSS, not the power source VDD, the change of the voltage level of the power source VDD no longer exerts an undesirable effect on the N-MOS FET 3B.

As contrasted with the N-MOS FET 3B, the bias voltage applied at the source electrode and the gate electrode of the P-MOS FET 3A is switched from the voltage level of the power source VDD to the voltage level of the power source VSS (in the OFF state). In addition, the bias voltage applied to the back gate section of the P-MOS FET 3A goes the zero volts, namely no voltage is applied to the back gate section of the P-MOS FET 3A, because the power source VDD enters the OFF state (is switched from the VDD voltage level to zero volts) and the N-MOS FET 3C for applying the bias voltage is in the OFF state. At the same time, the current path through N-MOS FET 3C to the power source VDD is cut. Thereby, there is no leak current in the protective circuit 3 of the first embodiment according to the present invention.

On the contrary, in the conventional protective circuit 103 as shown in FIG. 1, because the power source VDD is directly used as the bias voltage applied to the back gate section of the P-MOS FET 103A shown in FIG. 1 and the voltage level of the power source VDD is switched from the VDD voltage level to the VSS voltage level when the power source is not applied to the semiconductor integrated circuit chips under the control of the driver 35, leak current is generated at the P-N junction and flows through the P-N junction formed between the drain electrode and the back gate section of the P-MOS FET 103A connected to the input/output terminal 101 when a positive voltage level signal is applied to terminal 101.

The protective circuit 3 of the first embodiment according to the present invention as shown in FIGS. 6, 7 and 8 has the configuration that the bias voltage is applied to the back gate section of the P-MOS FET 3A through the N-MOS FET 3C. When the N-MOS FET 3C enters the OFF state a current can not be generated in the P-MOS FET 3A even if a signal of positive voltage level (which is also used in normal operation mode) is transferred to the input/output terminal 1 when the power source VDD is not supplied to the semiconductor integrated circuit chip. Of course, during the normal operation mode (namely, while the power source VDD is applied correctly to the semiconductor integrated circuit chip), the function of the protective circuit 3 of the first embodiment is equal to that of the conventional protective circuit 103 shown in FIG. 1.

As described above in detail, the protective circuit 3 of the first embodiment can have the withstand voltage level which is equal to that of the conventional protective circuit 103 shown in FIG. 1 and can protect the internal logic circuit 2 from generation of a leak current while the power source VDD applied to semiconductor integrated circuit chips is in the OFF state. In other word, there is no leak current in the protective circuit 3 of the embodiment even if the signal of the positive voltage level is applied to the input/output terminal while the VDD voltage level goes the VSS voltage level.

Embodiment 2

Figure 9:
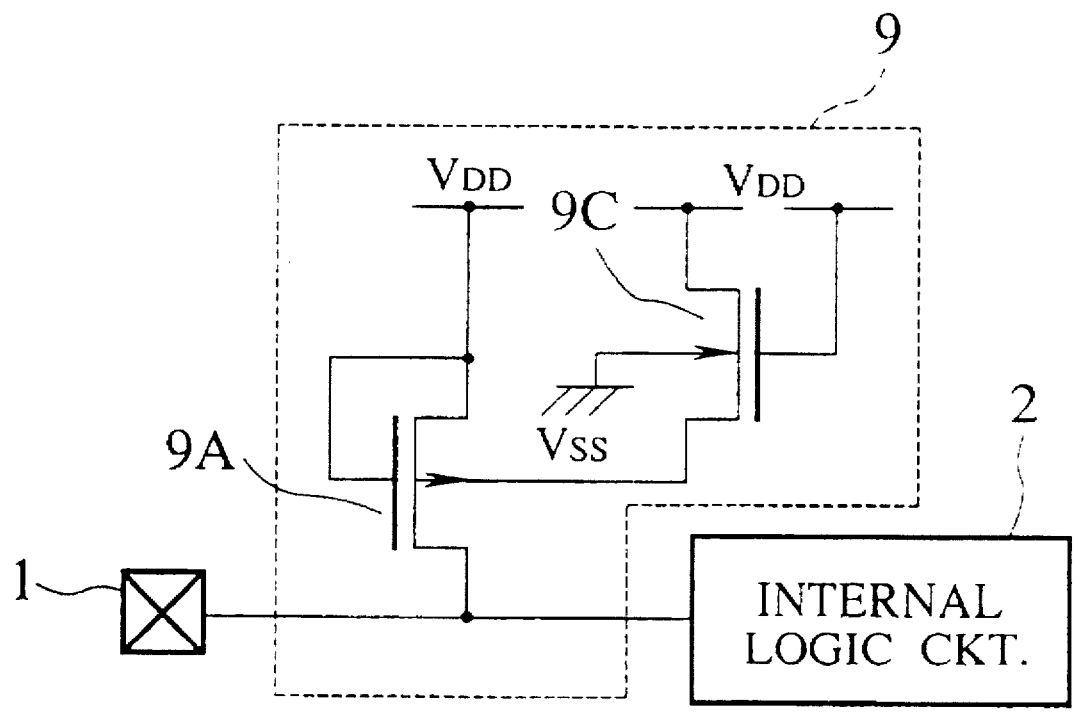
FIG. 9 is a configuration diagram of a semiconductor integrated circuit having a MOS FET type protective circuit according to the second embodiment of the present invention.
Figure 10:
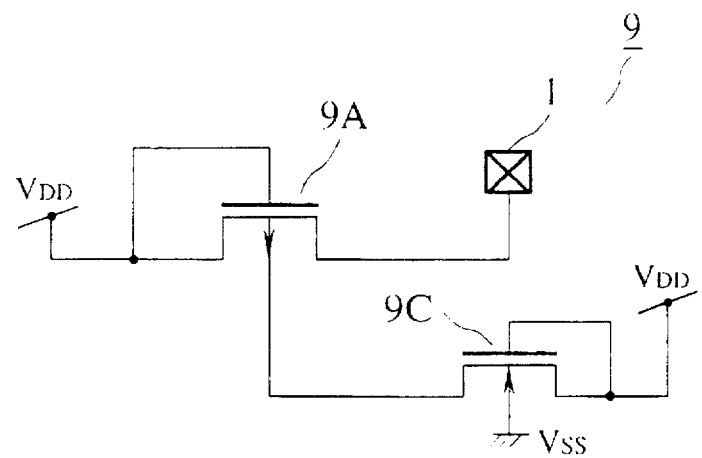
FIG. 10 is a circuit diagram showing the MOS FET type protective circuit according to the second embodiment of the present invention shown in FIG. 9.
Figure 11:
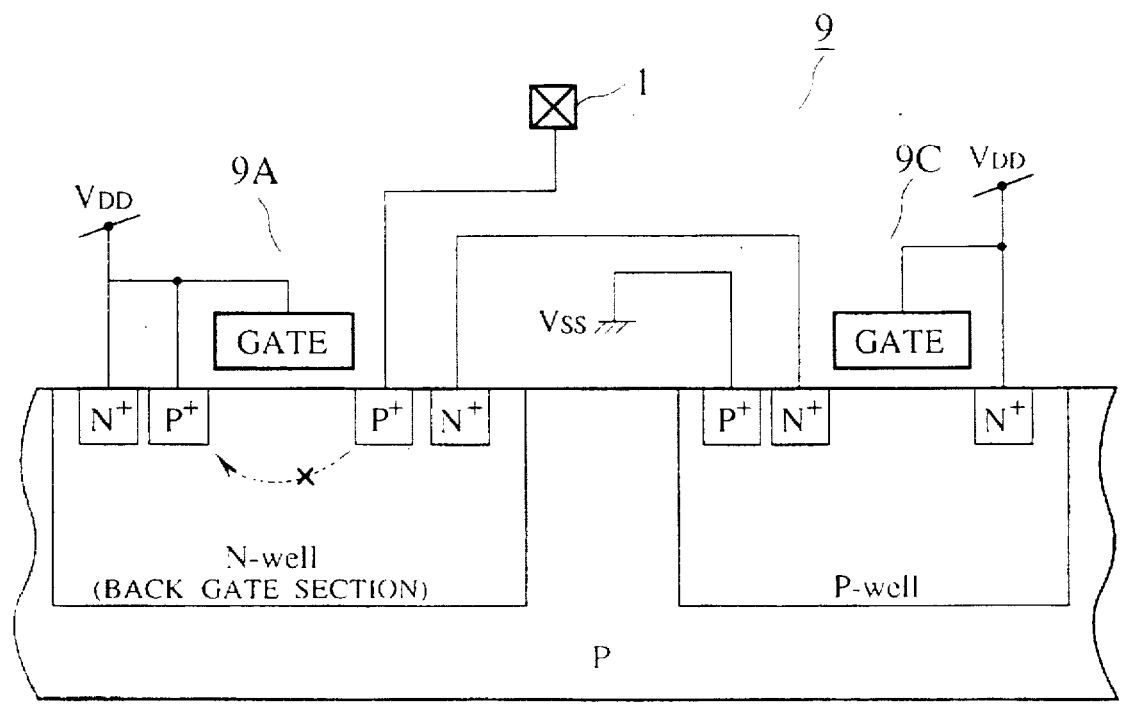
FIG. 11 is a schematic sectional view of the MOS FET type protective circuit according to the second embodiment of the present invention shown in FIG. 10.

FIG. 9 is a configuration diagram of a semiconductor integrated circuit having a MOS FET type protective circuit according to a second embodiment of the present invention. FIG. 10 is a circuit diagram showing the MOS FET type protective circuit shown in FIG. 9. FIG. 11 is a schematic sectional view of the MOS FET type protective circuit shown in FIG. 10. In the diagrams, a reference character 9 designates a P-MOS FET and a reference character 9C denotes a N-MOS FET. The same reference numbers and the same reference characters used in the protective circuit 3 of the first embodiment shown in FIGS. 6 to 8 are used for components in the protective circuit 9 of the second embodiment.

The difference between the protective circuit 9 of the second embodiment and the protective circuit 3 of the first embodiment that there is no N-MOS FET 3B in the protective circuit 9 of the second embodiment. That is, the protective circuit 9 comprises the P-MOS FET 9A and the N-MOS FET 9C.

As shown in FIG. 9, the drain electrode of the P-MOS FET 9A is connected to the input/output terminal 1 of the internal logic circuit 2 and the source electrode and the gate electrode of the P-MOS FET 9A are connected to the power source VDD so that the P-MOS FET 9A is in the OFF state. In addition, the bias voltage is applied to back gate section of the P-MOS FET 9A through the N-MOS FET 9C, not directly applied to the back gate section of the P-MOS FET 9A like the conventional protective circuit 103 shown in FIG. 1. In other words, the gate electrode and the drain electrode of the N-MOS FET 9C are connected to the power source VDD, the source electrode of the N-MOS FET 9C is connected to the back gate section of the P-MOS FET 9A and the power source VSS is applied as the bias voltage to the back gate section of the N-MOS FET 9C.

Next, the operation of the protective circuit 9 of the second embodiment will be explained.

First, the operation of the protective circuit 9 of the second embodiment will be explained under the condition that the power source VDD is supplied to the semiconductor integrated circuit chips 31 to 34 based on the control of the driver 35 shown in FIGS. 4A to 4C.

When the signal having a positive voltage level which is used in the normal operation mode is transferred to the input/output terminal 1, there is no leak current in the protective circuit 9 of the embodiment 2 because a reverse bias or no bias (zero volts, namely there is no voltage potential difference at the P-N junction) is applied to the P-N junction formed between the drain electrode and the back gate section of each of the P-MOS FET 9A and the N-MOS FET 9C. When a positive over-voltage whose voltage potential level is over the power source VDD is applied (or a negative over-voltage whose voltage potential level is less than the ground Vss is applied) to the input/output terminal 1, as shown in FIG. 11, a leak current flows through the P-N junction between the drain and back gate of the P-MOS FET 9A in the forward bias state. In this case, the flow of the leak current protects to destroy components in the internal logic circuit 2.

Next, the operation of the protective circuit 9 of the embodiment 2 while the power source VDD is not supplied to a semiconductor integrated circuit chip including the protective circuit 9 will be explained. For example, we will consider the operation of the protective circuit 9 of the second embodiment in a case that the power source VDD is not supplied to one of the semiconductor integrated circuit chips 31 to 34 under the control of the driver 35.

The bias voltage applied to the source electrode and the gate electrode of the P-MOS FET 9A is switched from the VDD voltage level to the VSS voltage level (zero volts). The N-MOS FET 9C, which applies the bias voltage to the P-MOS FET 9A during the normal operation mode, enters the OFF state. In this case, the current path between the power source VDD and the back gate section of the P-MOS FET 9A is cut.

In this state, when the signal of a positive voltage level used in the normal operation mode is transferred to the drain electrode of the P-MOS FET 9A, as shown in FIG. 11, no leak current is generated because there is no current path from the power source VDD to the back gate section of the P-MOS FET 9A. On the contrary, in the conventional protective circuit 103 as shown in FIG. 1, the power source VDD is directly used as the bias voltage applied to the back gate section of the P-MOS FET 103A. After the voltage level of the power source VDD is switched from the VDD voltage level to the VSS voltage level under the control of the driver 35, leak current is generated at the P-N junction formed between the drain electrode and the back gate section of the P-MOS FET 103A, when the signal of the positive voltage level is applied to the input/output terminal 101.

Because the protective circuit 9 of the second embodiment as shown in FIGS. 10 and 11 has the configuration that the bias voltage is applied to the back gate section of the P-MOS FET 9A through the N-MOS FET 9C, the P-MOS FET 9A in the protective circuit 9 has the same function of the P-MOS FET 103A in the conventional protective circuit 103 shown in FIG. 9 while the power source VDD is supplied to the semiconductor integrated circuit chip. In addition, because the N-MOS FET 9C is in the OFF state when the voltage level of the power source VDD goes the VSS voltage level, there is no leak current in the P-MOS FET 9A even if signals of the positive voltage level are transferred to the input/output terminal 1.

Thus, the protective circuit 9 has the same withhold voltage function of the conventional protective circuit 103 shown in FIG. 1 and it can interrupt the leak current and cut off the generation of the leak current while the voltage level of the power source VDD Goes the VSS voltage level, similar to the protective circuit 3 of the first embodiment shown in FIGS. 6, 7 and 8.

Figure 12:
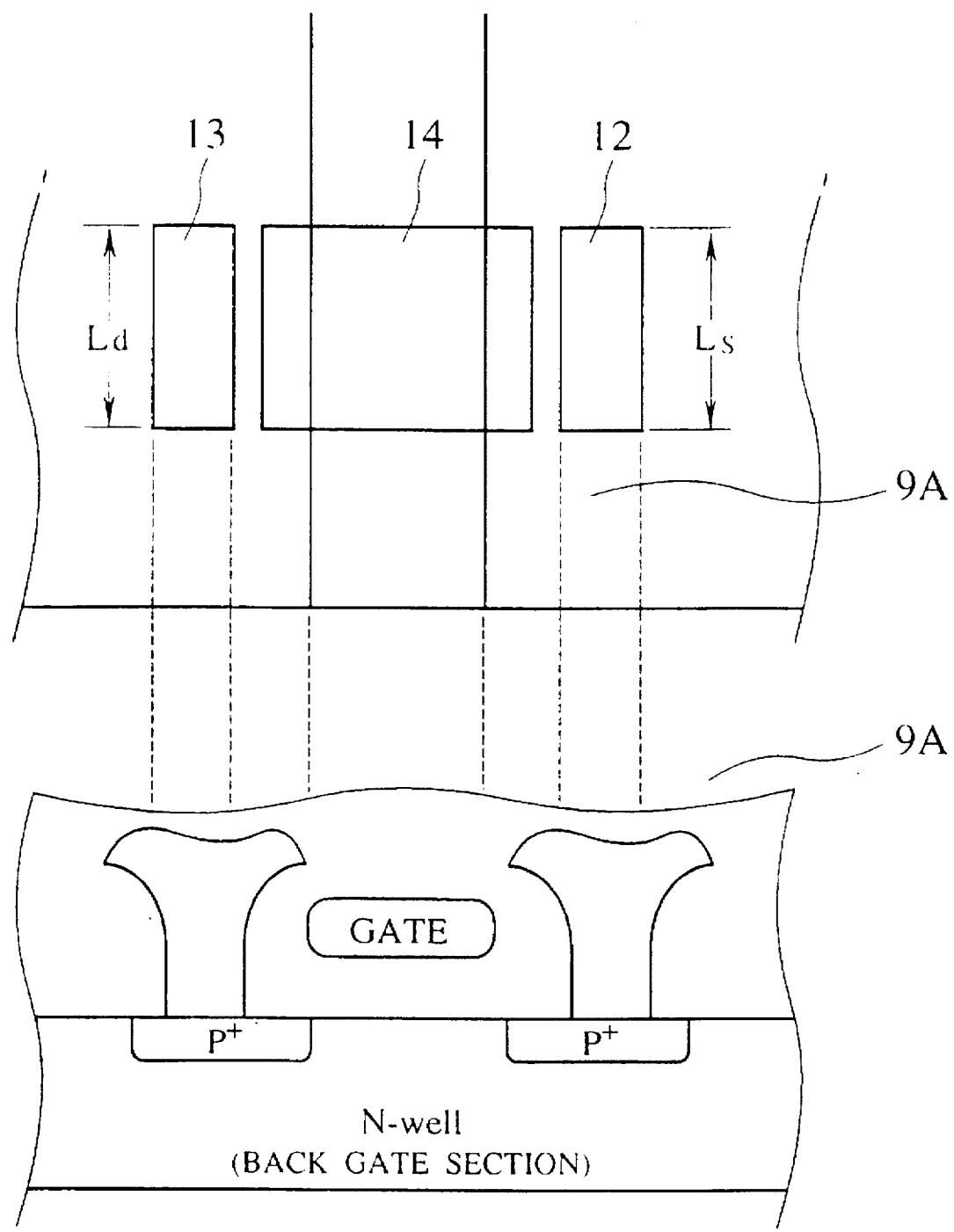
FIG. 12 is a perspective view of a P-MOS FET in the MOS FET type protective circuit according to the second embodiment of the present invention shown in FIG. 10.

FIG. 12 is a perspective view of the P-MOS FET 9A in the MOS FET type protective circuit 9 as the second embodiment of the present invention as shown in FIG. 10. In the diagram, a reference number 12 designates a source contact region, a reference number 13 denotes the drain contact region, and a reference number 14 indicates the gate contact region.

When the protective circuit 3 of the first embodiment is compared with the protective circuit 9 of the second embodiment in configuration and function, there is no N-MOS FET 3B in the protective circuit 9 of the second embodiment. In this configuration of the second embodiment, a source length Ls in the source region 12 and a drain length Ld in the drain region 13 in the P-MOS FET 9A in the protective circuit 9 as the second embodiment shown in FIGS. 9 to 11 must be at least more than two or three times larger than those of the P-MOS FET 3A in the protective circuit 3 of the first embodiment shown in FIG. 6. Thereby, the protective circuit 9 of the second embodiment can have the same function of the protective circuit 3 of the first embodiment in function and operation. In other words, the protective circuit 9 has the same withhold voltage function of the protective circuit 3 and can cut the leak current designated by the dashed line shown in FIG. 11 while the voltage level of the power source VDD goes the VSS voltage level.

Figure 13:
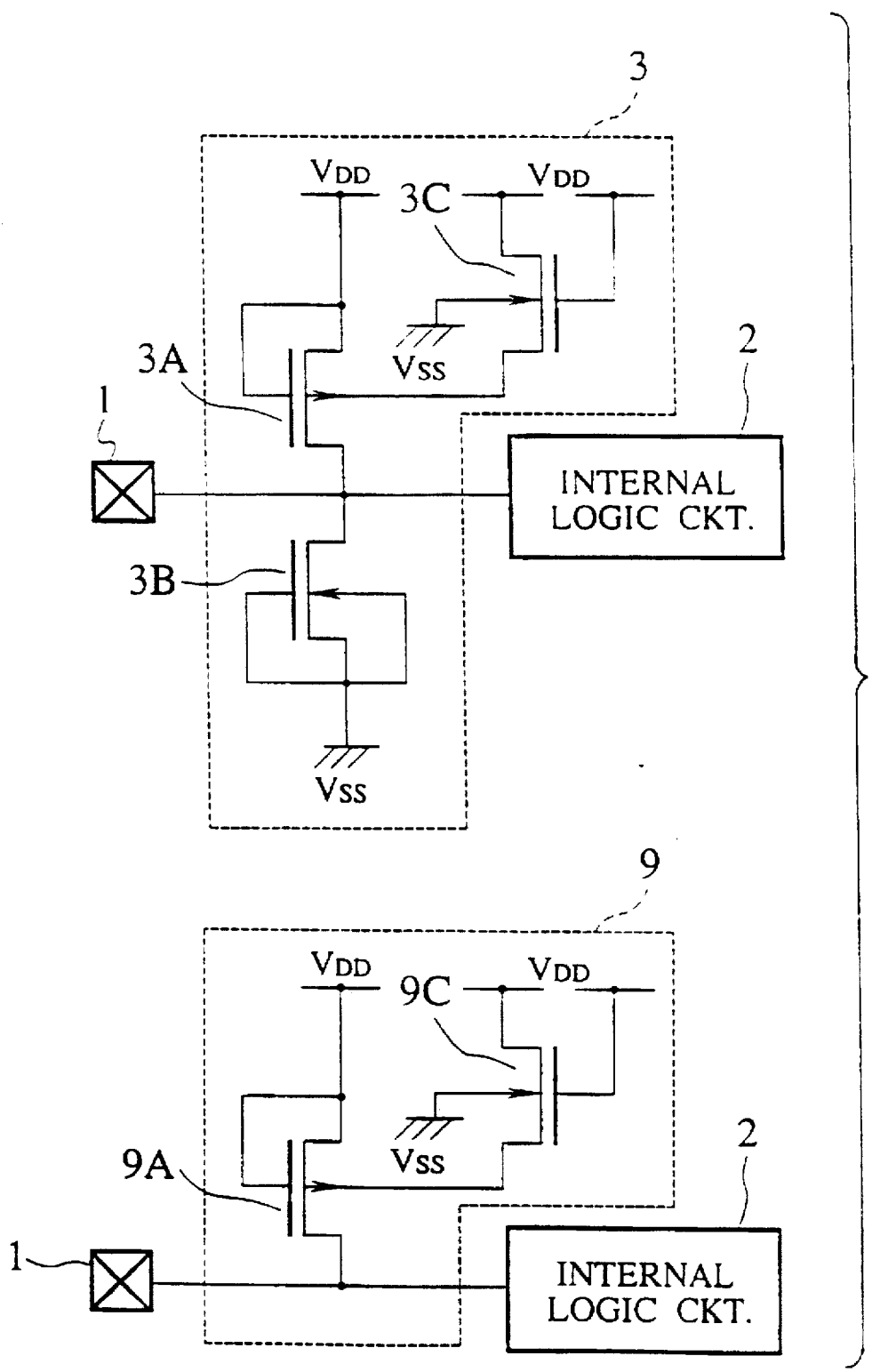
FIG. 13 is a circuit diagram of a semiconductor integrated circuit having an MOS FET type protective circuit having five MOS FETs.

FIG. 13 is a circuit diagram of a semiconductor integrated circuit having a first protective circuit according to FIG. 6 and a second protective circuit according to FIG. 9. The elements shown in FIG. 13 correspond to those shown in FIGS. 6 and 9 and have been given the same reference numerals.

While the above provides a full and complete disclosure of the preferred embodiment of the present invention, various modifications, alternate constructions and equivalents any be employed without departing from the true spirit and scope of the invention. Therefore the above description and illustration should not be construed as limiting the scope of the present invention, which is defined by the appended claims.

What is claimed is:

1. A protective circuit for protecting against an over voltage of more than a predetermined voltage potential level supplied to an input/output terminal for receiving and transferring signals in a semiconductor circuit, comprising:

a first MOS FET of a first conductivity type having a drain electrode connected to the input/output terminal and a source electrode and a gate electrode connected to a first power source; and a second MOS FET of a second conductivity type having a source electrode connected to a back gate of the first MOS FET, a drain electrode and a gate electrode connected to the first power source, and a back gate connected to a second power source.

2. A protective circuit for protecting against an over-voltage having a predetermined voltage potential level supplied to an input/output terminal for receiving and transferring signals in a semiconductor circuit, comprising:

a first MOS FET of a first conductivity type having a drain electrode connected to the input/output terminal, and a source electrode and a gate electrode connected to a first power source;

a second MOS FET of a second conductivity type having a source electrode connected to a back gate of the first MOS FET, a drain electrode and a source electrode connected to the first power source, and a back gate connected to a second power source; and a third MOS FET of the second conductivity type having a drain electrode connected to the input/output terminal, and a source electrode, a gate electrode and a back gate commonly connected to the second power source.

3. A protective circuit as claimed in claim 1, wherein, a voltage level of the first power source is higher than a voltage level of the second power source.

4. A protective circuit as claimed in claim 2, wherein, a voltage level of the first power source is higher than a voltage level of the second power source.

5. A protective circuit as claimed in claim 1, wherein the first MOS FET is a P-MOS FET and the second MOS FET is an N-MOS FET.

6. A protective circuit as claimed in claim 2, wherein the first MOS FET is a P-MOS FET and each of the second and third MOS FETs are N-MOS FETs.

7. A protective circuit for protecting against an over voltage having more than a predetermined voltage potential level supplied to an input/output terminal of a semiconductor integrated circuit, comprising:

a first MOS FET of a first conductivity type having a drain electrode connected to the input/output terminal and a source electrode and a gate electrode connected to a first power source; and a second MOS FET of a second conductivity type having a source electrode connected to a back gate of the first MOS FET, a drain electrode and a gate electrode connected to the first power source, and a back gate connected to a second power source; and at least one internal logic circuit connected to the protective input/output terminal.

8. A protective circuit for protecting against an over-voltage having more than a predetermined voltage potential level supplied to an input/output terminal of a semiconductor integrated circuit, comprising:

a first MOS FET of a first conductivity type having a drain electrode connected to the input/output terminal, and a source electrode and a gate electrode connected to a first power source;

a second MOS FET of a second conductivity type having a source electrode connected to a back gate of the first MOS FET, a drain electrode and a gate electrode connected to the first power source, and a back gate connected to a second power source; and a third MOS FET of the second conductive type having a drain electrode connected to the input/output terminal and a source electrode, a gate electrode and a back gate commonly connected to the second power source; and at least one internal logic circuit connected to the protective circuit.

9. A semiconductor integrated circuit, comprising:

a first type protective circuit for protecting a semiconductor integrated circuit from an over voltage having a predetermined voltage potential level supplied to a first input/output terminal in the a semiconductor integrated circuit, comprising:

a first MOS FET of a first conductivity type having a drain electrode connected to the first input/output terminal and a source electrode and a gate electrode connected to a first power source; and a second MOS FET of a second conductivity type having a source electrode connected to a back gate of the first MOS FET, a drain electrode and a gate electrode connected to the first power source, and a back gate connected to a second power source;

a second type protective circuit for protecting the semiconductor integrated circuit from over-voltage supplied to a second input/output terminal in the semiconductor integrated circuit, comprising:

a third MOS FET of the first conductivity type having a drain electrode connected to the second input/output terminal and a source electrode and a gate electrode connected to the first power source;

a fourth MOS FET of the second conductivity type having a source electrode connected to a back gate of the third MOS FET, a drain electrode and a gate electrode are connected to the first power source, and a back gate connected to the second power source; and a fifth MOS FET of the second conductivity type having a drain electrode connected to the second input/output terminal and a source electrode, a gate electrode and a back gate commonly connected to the second power source; and at least two internal logic circuits connected to the first type and the second type protective circuits.

10. A semiconductor integrated circuit as claimed in claim 9, wherein a source length and a drain length of the third MOS FET is formed to be approximately at least double of a source length and a drain length of the first MOS FET.

11. A semiconductor integrated circuit as claimed in claim 7, wherein a voltage level of the first power source is higher than a voltage level of the second power source.

12. A semiconductor integrated circuit as claimed in claim 8, wherein a voltage level of the first power source is higher than a voltage level of the second power source.

13. A semiconductor integrated circuit as claimed in claim 9, wherein a voltage level of the first power source is higher than a voltage level of the second power source.

14. A semiconductor integrated circuit as claimed in claim 10, wherein a voltage level of the first power source is higher than a voltage level of the second power source.

15. A semiconductor integrated circuit as claimed in claim 7, wherein the first MOS FET is a P-MOS FET and the second MOS FET is an N-MOS FET.

16. A semiconductor integrated circuit as claimed in claim 8, wherein the first MOS FET is a P-MOS FET and each of the second MOS FET and the third MOS FET is a N-MOS FET.

17. A semiconductor integrated circuit as claimed in claim 9, wherein the first MOS FET is a P-MOS FET and each of the second MOS FET and the fifth MOS FET is an N-MOS FET.

18. A semiconductor integrated circuit as claimed in claim 10, wherein the first MOS FET is a P-MOS FET and each of the second MOS FET and the fifth MOS FET is an N-MOS FET.

* * * * *